Sept. 3, 1968 E. OLOFF 3,400,345

TUNING SELECTION SYSTEM FOR UHF AND VHF TELEVISION BANDS

Filed Nov. 24, 1964 2 Sheets-Sheet 1

United States Patent Office 3,400,345

Patented Sept. 3, 1968

3,400,345
TUNING SELECTION SYSTEM FOR UHF AND VHF TELEVISION BANDS

Edwin Oloff, Osterode am Harz, Germany, assignor to Imperial-Rundfunk- und Fernseewerk GmbH, Osterode am Harz, Germany Filed Nov. 24, 1964, Ser. No. 413,483
Claims priority, application Germany, Nov. 27, 1963, J 24,803
4 Claims. (Cl. 334—47)

Figure 1:
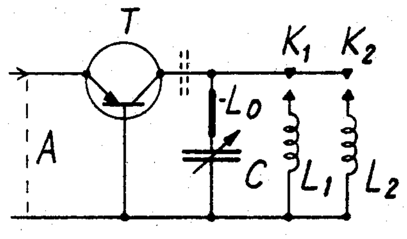

The present invention relates to structures for tuning ultra-short waves, and in particular the present invention relates to devices which are used for tuning television sets.

For such purposes, it is conventional to provide structures which can be changed over among a plurality of different regions for the purpose of tuning in the most important television bands (band I–band V). In conventional television receivers it is most common to use tuners for bands I and III (relatively long ultra-short waves, known as VHF waves), and the conventional receivers have an entirely separate, special tuner for the shorter ultra-short waves (known as UHF waves), these shorter ultra-short waves being included in bands IV and V.

With conventional structures, in addition to tuning within the bands themselves, there are provided special, manually operable devices to switch over from one band to another.

There are known devices provided with push-buttons by which it is possible to provide directly adjustments for a few particular transmitters, but with such constructions it is not possible to provide a gap-free tuning throughout all of the frequency ranges of the different bands (VHF and UHF) in a relatively quick and convenient manner.

A primary object of the present invention is to simplify and improve known systems for tuning and for changing between different bands.

A further object of the present invention is to provide a single unitary structure which makes it possible to quickly and conveniently tune throughout the entire frequency ranges of different bands without requiring any manual actuation of a structure to produce change-over from one band to another.

In particular, it is an object of the present invention to provide a structure which makes it possible to tune throughout the entire frequency ranges of all of the television bands with a single adjustable capacitor, preferably in the form of a rotary capacitor.

Furthermore, it is an object of the present invention to provide for a structure of the above type a single drive which will not only bring about tuning throughout the several individual bands, but which will also automatically produce change-over from one band to another during operation of the drive.

In addition, it is an object of the present invention to provide an indicating means which through a suitable pointer and scale arrangement will conveniently indicate on a single scale which is common to all of the bands the tuning which is brought about with the structure of the invention.

According to a primary feature of the invention, the tuning system includes a transistor circuit in which a plurality of inductances are provided for the several bands, respectively, and in which the inductance for the band of highest frequency is connected in series with an adjustable tuning condenser, which remains connected into the circuit at all times, the remaining inductances being selectively connected in parallel with this single adjustable capacitor during use of the apparatus for tuning in bands other than that of the highest frequency.

Figure 2:
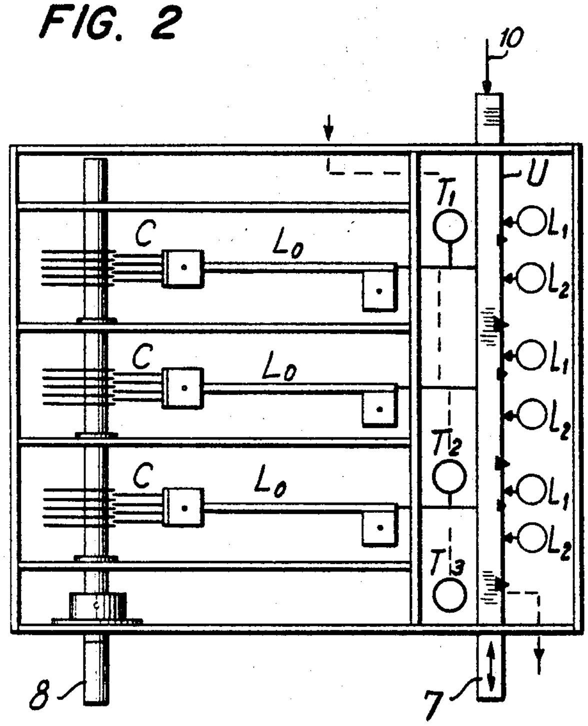
Figures 3, 3A:
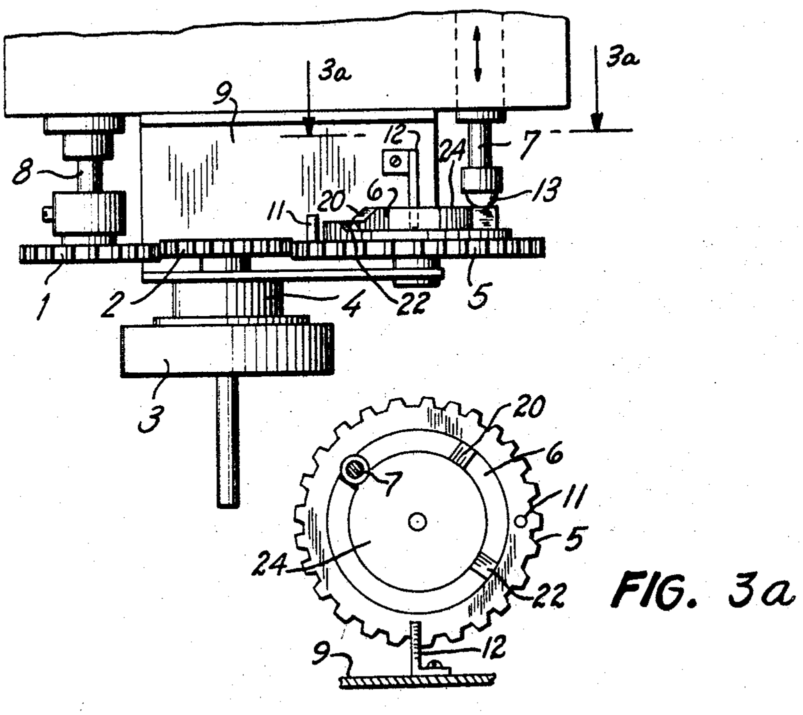
Figure 4:
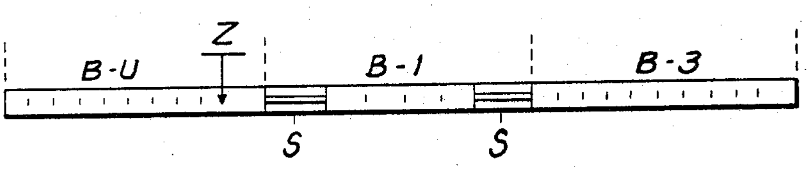

The invention is illustrated by way of example in the accompanying drawings which form part of the application and in which:

FIG. 1 illustrates the basic circuit of the invention for providing tuning within the bands as well as change-over from one band to another;

FIG. 2 schematically illustrates the entire tuning assembly of the invention;

FIG. 3 shows a drive means of the invention and in particular how it is connected to the structure shown at the lower part of FIG. 2 for operating the structure of FIG. 2; and FIG. 3*a* is a rear elevation of the drive means shown in FIG. 3, taken along the line 3A—3A of FIG. 3;

FIG. 4 diagrammatically illustrates a pointer and scale arrangement of the invention for indicating the tuning adjustments which are made with the structure of FIGS. 1–3.

Referring now to FIG. 1, there is shown therein the tuning elements of the system of the invention for changing over between bands as well as for tuning, FIG. 1 illustrating the transistor circuit of one of a plurality of stages of the structure which may include two or three stages.

In the circuit shown in FIG. 1, the transistor T is arranged in the secondary TV assembly so that the input voltage A is fed to the emitter of the transistor. The tuning capacitor (preferably a rotary capacitor) is connected in the collector circuit of the capacitor in series with a line inductance $L_0$. The inductance $L_0$ is formed by a suitable conductor and is adapted (lengthwise) to the shorter band where the UHF range of frequencies is situated, and a sufficient tuning range is provided by the adjustment of the tuning capacitor from approximately 470 mHz. up to approximately 940 mHz.

The change-over to band I (41 to 68 mHz.) is brought about in accordance with the invention in an extremely simple manner requiring only, with the circuit in FIG. 1, the actuation of the switch $K_1$ in order to connect the inductance coil $L_1$ into the circuit.

The change-over to the next band (for example band III of approximately 174 to 218 mHz.) is brought about by connecting the inductance $L_2$ into the circuit, through actuation of the switch $K_2$, and of course, in an analogous manner additional bands can be connected into the circuit.

In accordance with a particular feature of the invention, the inductance for the band of shortest wave length (UHF) $L_0$, in the form of a conductor or small coil, is maintained at all times in the transistor circuit connected to the transistor T and to the capacitor C, so that for the band of shortest wave length (in the region of UHF) there can be no faulty operation or any danger of breakdown or the like which might result from the presence of switch contacts which must be placed into and out of engagement with each other. As may be seen from FIG. 1, the tuning for the band of highest frequency (UHF) is brought about through electrical connection with the transistor T in a series arrangement of the inductance $L_0$ and the tuning capacitor C, while for the VHF bands (band I and band III) a parallel connection of the inductances corresponding to these latter bands and the tuning capacitor C is provided, so that in the bands of different frequency ranges it is always possible to provied the best type of tuning.

The basic arrangement shown in FIG. 1 and described above, is illustrated in FIG. 2 in three tuning stages (input and oscillator stages) where the arrangement of FIG. 1 is repeated in principle in the several stages. The several tuning capacitors C of the individual stages are in a known way arranged in separate chambers and have with respect to the inductances $L_0$ fixed connections in all of the stages, the several inductances being fixed to the electrode or to the fixed-coupling capacitor.

The space in the housing of FIG. 2 which is situated beside the several chambers for the capacitors and inductances $L_0$ (to the right of these latter chambers) contains the transistors $T_1$, $T_2$, $T_3$ of the individual stages (input and oscillator) in which in a known way the intermediate frequencies are achieved.

The change-over between the several bands (UHF VHF) takes place through a switching means U in the form of an elongated adjusting member 7 capable of being moved longitudinally as shown by the double-headed arrow at the lower right of FIG. 2 with member 7 exerting a downward force as indicated by arrow 10, so as to provide the closing of the switches for connecting either the band coils $L_1$ or the band coils $L_2$ into the circuits in the individual stages.

The drive means for carrying out the adjustment of the structure of FIG. 2 can advantageously take the form illustrated in FIG. 3 where the elements of the drive are shown connected to the lower part of the structure shown in FIG. 2, so that the drive means is operatively connected with the rotary shaft 8 which is operatively connected to the several capacitors C for adjusting the latter, as well as to the means 7 for changing-over between the different bands. The drive means is mounted on the housing by way of an angle bracket 9.

The drive for the tuning assembly is provided by a flywheel drive means 3, 4 which has a stepdown transmission ratio of from 25 to 1 up to 40 to 1, it being understood that any transmission ratios suitable for the particular application may be used. The gear 2 of this drive transmits the drive to the gear 1 which is connected through the shaft 8 to the rotary capacitors, the transmission ratio between the gears 1 and 2 being 1 to 1. As shown in FIGS. 3 and 3*a*, cam 6 is a hollow cylindrical shaped body having first and second sharply inclined ramps, 20 and 22, on its cam surface 24, with ramps 20 and 22 acting as steps by which change over members 7 acts to provide automatic switching from one range to the next range.

Also, the gear 2 transmits the drive, at the side of the gear opposite from the gear 1, to a cam wheel 5 (for producing change-over between bands), the drive to the cam wheel 5 being such that for one or two rotations of the gear 2 (and the gear 1), the wheel 5 does not turn through a full revolution. By a suitable stop arrangement, such as pin 11, on the cam wheel 5 the rotation thereof is limited in such a way by engagement, with fixed stop 12 secured to bracket 9 so that the rotary capacitor (gear 1) can turn through three half-revolutions in the same direction (and then back again), so that it is possible to provide corresponding threee band tuning adjustments one after the other by actuation of the drive with full tuning throughout the entire band ranges, which is to say with full variation in the adjustment range of the capacitors for each band.

The change-over from one band to another, by rotation of the cam wheel 5 from the gear 2, is brought about by a cam 6 which is carried by the wheel 5 for rotation therewith, the arrangement being such that the change-over from one band to another takes place at the beginning and at the end of the second half revolution; so that the change-over takes place automatically at the beginning and at the end of the second band-tuning operation.

With the preferred structure the cam 6 is stepped as shown in FIGS. 3 and 3*a* by ramps steps 20 and 22 so that the change-over means 7 is under axial pressure, as indicated by the arrow 10 in FIG. 2, which axial pressure is transmitted to tip 13 of member 7 as it rides along the cam surface 24 including steps 20 and 22 thereon.

Thus, for the UHF band no switching action is necessary, since inductor coil $L_0$ is permanently connected to tuning capacitor C across the base to emitter terminals of transistor T. In order to switch to band I of the VHF range, one switching step takes place, i.e. along ramp step 20, to thereby connect coil $L_1$ into the tank circuit of transistor $T_1$; and to switch to band III of the VHF range, a second switching step takes place i.e. along ramp 22, to thereby connect coil $L_2$ into the tank circuit of transistor T.

The tuning with the above described drive can take place very quickly through all three bands or, for very accurate tuning, the adjustment can be carried out in the individual bands for fine tuning purposes.

In contrast to known sytems, it is possible with the structure of the invention to carry out a gap-free seeking of the proper tuning for the different bands (for example by observation of the like) in an extremely quick and completely reliable manner. By the use of the flywheel drive, the switching which takes place between the bands either at the beginning or at the end of the intermediate band, is not noticeable. It is also possible, in a known manner to provide electromagnetic switches for providing the change-over from one band to another, so that the cam wheel 5 would in such case be used only for a actuating electrical switches which would not require any power.

The indicating means illustrated in FIG. 4 takes the form of a scale which is linearly arranged and where the different television bands are situated in series so as to provide a particularly clear indicating arrangement.

In the indicating arrangement all of the bands, namely the UHF band (designated B–U) band I (designated B–1) and band III (designated B–3), are swept through and indicated by a single pointer Z which moves successively through the different portions of the scale. The change-over from one band to the next is situated, as illustrated, at the smallest band I where the change-over zones S are situated at the beginning and at the end, respectively, of the band I. Important transmitting stations can be indicated on the scale through conspicious indicia which can be adjustable. The scale, as described, is formed in such a way that in addition to the transmitting stations the particular bands are also indicated. In many cases, detents which can be felt during the adjustment can be provided for the most important transmitting stations, and different colors or signal lamps can be used for the different bands.

The tuning system of the invention can be used with particular advantage together with an electromotive drive.

Thus, as is apparent from the above description, the tuning throughout all of the bands I–V takes place through the same adjustable capacitor, preferably in the form of a rotary condenser connected in series with the inductance provided for the bands IV and V, while the television bands I and III are connected in parallel, as indicated above for the inductance coils corresponding thereto.

The bands IV and V are thus combined together to form the common UHF band, so that this one latter band together with the television bands I and III form a total of three bands required to be selected from with the arrangement of the invention. Of course, with the structure of the invention, instead of a conventional separate arrangement of individual tuning assemblies for VHF and UHF, there is only the one unitary structure so that with the structure of the invention there is a considerable reduction in cost.

Moreover, with the structure of the invention not only is the tuning for all of the bands brought about through the single rotary capacitor, but in addition this capacitor provides tuning throughout all of the entire range during rotation in a single direction, and the continued rotation in this one direction provides also the change-over from one band to another.

With the arrangement of the invention, as is particularly apparent from the indicating scale shown in FIG. 4, not only are the bands successively tuned one after the other, but in addition the band with the smallest number of transmitting channels (for example the band I) is arranged between the portions of the scale for the other bands with the greater the portions of the scale for the other bands with the greater number of transmitting channels (the UHF band and band III), so that the latter bands are respectively situated at the beginning and end of the smaller band.

The change-over from one band to another takes place, therefore, at the beginning and at the end of the intermediate, smaller band, so that in the broader bands there is no necessity for space for changing-over and the full tuning range can be provided with the tuning element.

The rotary tuning capacitor for tuning the several bands is formed in such a way that rotation of the capacitor in the same direction will produce the desired results. The tuning capacitor increases during the first tuning stage (180°) up to the highest value, while in the second tuning stage, the tuning capacitor decreases again to the minimum value (180+180°), and in the third tuning stage (as in the first) the tuning capacitor again continuously increases up to the highest value (360+180°).

What is claimed is:

1. A tuning selector system for UHF and VHF television bands adaptable for connection with an input transistor, said tuning selector system comprising, a UHF circuit having a variable capacitor in series with a first inductor coil adapted to be fixedly connected across the base to collector of said input transistor, a coil selector circuit having a plurality of additional coils each of which corresponds to a particular frequency range in the VHF band, and switching means for selectively connecting one of said additional coils in parallel with said UHF tuning circuit to provide a tank tuning circuit for each of said corresponding frequency ranges in the VHF band, said coil selector circuit comprising a second inductor coil, and a third inductor coil having one of its ends connected to one end of said second inductor coil, and drive means for actuating said inductor switching means, said variable capacitor being of the air-dielectric rotary plate type, said drive means comprising a flywheel drive including a gear transmission system, said gear transmission system having a driving gear, a first gear coupled to said driving gear for rotating said variable plate capacitor, and a second gear coupled to said driving gear for driving said inductor switching means.

2. A tuning selector system for UHF and VHF television bands as defined in claim 1, wherein said inductor switching means comprises a rotary cam rotatably coupled to said second gear, said rotary cam having a cam surface having first, second and third levels, with a first sharply inclined ramp step connecting said first and second levels, and a second sharply inclined ramp step connecting said second and third levels, a rod having fixed switch contacts thereon with one of the ends of said rod being spring biased in contact with said cam surface, whereby upon the application of rotative drive to said driving gear, said driving gear is operative to concurrently rotate said rotary capacitor and said cam, causing said rod end to slidably move along said cam surface.

3. A tuning selector system for UHF and VHF television bands as defined in claim 2 wherein said first cam surface level corresponds to said UHF band, said second cam surface level corresponds to band I of the VHF range, and said third cam surface level corresponds to band III of the VHF range.

4. A tuning selector system for UHF and VHF television bands comprising a plurality of tuning selector units, each of said tuning selector units being adapatable for connection to an input transistor and housed in separate adjacent chambers of a single housing for said tuning selector system: each of said tuning selector units comprising a UHF tuning circuit having a variable capacitor in series with a first inductor coil fixedly connected across the base to collector of said input transistor, a coil selector circuit having a plurality of additional coils each of which corresponds to a particular frequency range in the VHF band, and switching means for selectively connecting one of said additional coils in parallel with said UHF tuning circuit to provide a tank tuning circuit for each of said corresponding frequency ranges in the VHF band, with each of said variable capacitors in said tuning selector units being ganged together for concurrent variation of capacitance.

References Cited

UNITED STATES PATENTS

| | | | |
|---|---|---|---|
| 2,997,582 | 8/1961 | Silvey | 334—2 |
| 3,275,958 | 9/1966 | Rehm | 334—3 |

FOREIGN PATENTS

| | | |
|---|---|---|
| 712,261 | 10/1941 | Germany. |
| 502,178 | 1939 | Great Britain. |
| 57,804 | 7/1946 | Netherlands. |

HERMAN KARL SAALBACH, *Primary Examiner.*

P. L. GENSLER, *Assistant Examiner.*